(12) United States Patent
Stancu et al.

(10) Patent No.: US 7,609,050 B2
(45) Date of Patent: Oct. 27, 2009

(54) METHOD AND SYSTEM FOR DETERMING CURRENT IN AN ELECTRICAL COMPONENT IN A POWER CONVERSION SYSTEM

(75) Inventors: Constantin C. Stancu, Anaheim, CA (US); Daniel L. Kowalewski, Redondo Beach, CA (US)

(73) Assignee: GM Global Technology Operations, Inc., Detroit, MI (US)

( * ) Notice: Subject to any disclaimer, the term of this patent is extended or adjusted under 35 U.S.C. 154(b) by 334 days.

(21) Appl. No.: 11/676,576

(22) Filed: Feb. 20, 2007

(65) Prior Publication Data
US 2008/0196950 A1 Aug. 21, 2008

(51) Int. Cl.
*G01N 27/416* (2006.01)
(52) U.S. Cl. .................................................. 324/120
(58) Field of Classification Search ............... 320/104, 320/107, 130, 141; 324/76.11, 201; 180/65.1; 363/21.01
See application file for complete search history.

(56) References Cited

U.S. PATENT DOCUMENTS

| 5,402,053 | A | * | 3/1995 | Divan et al. | 318/768 |
| 5,650,705 | A | * | 7/1997 | Hart | 318/635 |
| 6,608,767 | B1 | * | 8/2003 | Stanley | 363/16 |

* cited by examiner

*Primary Examiner*—Edward Tso

(57) ABSTRACT

A method and system for determining a current flowing through an electrical component are provided. A switch electrically coupled to the electrical component and two voltage sources is activated. The activation of the switch causes current to flow through the electrical component after an amount of time. The amount of time between said activating the switch and the flow of current through the electrical component is determined. The current flowing through the electrical component is measured to determine a measured current value. The measured current value is modified based at least in part on the amount of time between said activating the switch and the flow of current through the electrical component.

20 Claims, 3 Drawing Sheets

US 7,609,050 B2

METHOD AND SYSTEM FOR DETERMING CURRENT IN AN ELECTRICAL COMPONENT IN A POWER CONVERSION SYSTEM

TECHNICAL FIELD

The present invention generally relates to electrical components, and more particularly relates to a method and system for determining the current flowing through electrical components.

BACKGROUND OF THE INVENTION

In recent years, advances in technology, as well as ever evolving tastes in style, have led to substantial changes in the design of automobiles. One of the changes involves the complexity, as well as the power usage, of the various electrical systems within automobiles, particularly alternative fuel vehicles, such as hybrid, electric, and fuel cell vehicles.

Such vehicles, particularly fuel cell vehicles, often use two separate voltage sources, such as a battery and a fuel cell, to power the electric motors that drive the wheels. Power converters, such as direct current-to-direct current (DC/DC) converters, are typically used to manage and transfer the power from the two voltage sources. Modern DC/DC converters often include transistors electrically interconnected by an inductor. By controlling the states of the transistors, a desired average current can be impressed through the inductor.

For control and feedback purposes, the current through the inductor is measured. Typically, this measurement occurs at a mid-point of a duty cycle, or "on-period," of one of the transistors, as theoretically the inductor current will be at its average value at that point. However, due to an inherent delay between the activation of the transistor and the flow of current through the transistor and/or the inductor, the current measurement may be inaccurate. As a result, performance of the power converter, as well as the vehicle, may be less than optimal.

Accordingly, it is desirable to provide a system and method for improving the accuracy of the feedback current conducting through an electrical component, such as an inductor in a DC/DC converter. Furthermore, other desirable features and characteristics of the present invention will become apparent from the subsequent detailed description and the appended claims, taken in conjunction with the accompanying drawings and the foregoing technical field and background.

SUMMARY OF THE INVENTION

According to one embodiment, a method is provided for determining a current flowing through an electrical component. A switch electrically coupled to the electrical component and two voltage sources is activated. The activation of the switch causes current to flow through the electrical component after an amount of time. The amount of time between said activating the switch and the flow of current through the electrical component is determined. The current flowing through the electrical component is measured. The measured current is modified based at least in part on the amount of time between said activating the switch and the flow of current through the electrical component.

According to another embodiment, an automotive drive system is provided. The system includes a first voltage source to generate a first voltage, a second voltage source to generate a second voltage, a power converter, having a switch and an inductor, coupled to the first voltage source and the second voltage source, an electric motor coupled to the power converter, and a microprocessor in operable communication with the power converter. The microprocessor is configured to activate the switch to cause current to flow through the inductor after an amount of time, determine the amount of time between the activation of the switch and the flow of current through the inductor, determine a measured current value the current flowing through the inductor, and modify the measured current value based at least in part on the amount of time between the activation of the switch and the flow of current through the inductor.

DESCRIPTION OF THE DRAWINGS

The present invention will hereinafter be described in conjunction with the following drawing figures, wherein like numerals denote like elements.

DESCRIPTION OF AN EXEMPLARY EMBODIMENT

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

The following description refers to elements or features being "connected" or "coupled" together. As used herein, unless expressly stated otherwise, "connected" means that one element/feature is directly joined to (or directly communicates with) another element/feature, and not necessarily mechanically. Likewise, unless expressly stated otherwise, "coupled" means that one element/feature is directly or indirectly joined to (or directly or indirectly communicates with) another element/feature, and not necessarily mechanically. However, it should be understood that although two elements may be described below, in one embodiment, as being "connected," in alternative embodiments similar elements may be "coupled," and vice versa. Thus, although the schematic diagrams shown herein depict example arrangements of elements, additional intervening elements, devices, features, or components may be present in an actual embodiment. It should also be understood that FIGS. 1-3 are merely illustrative and may not be drawn to scale.

Figure 1:
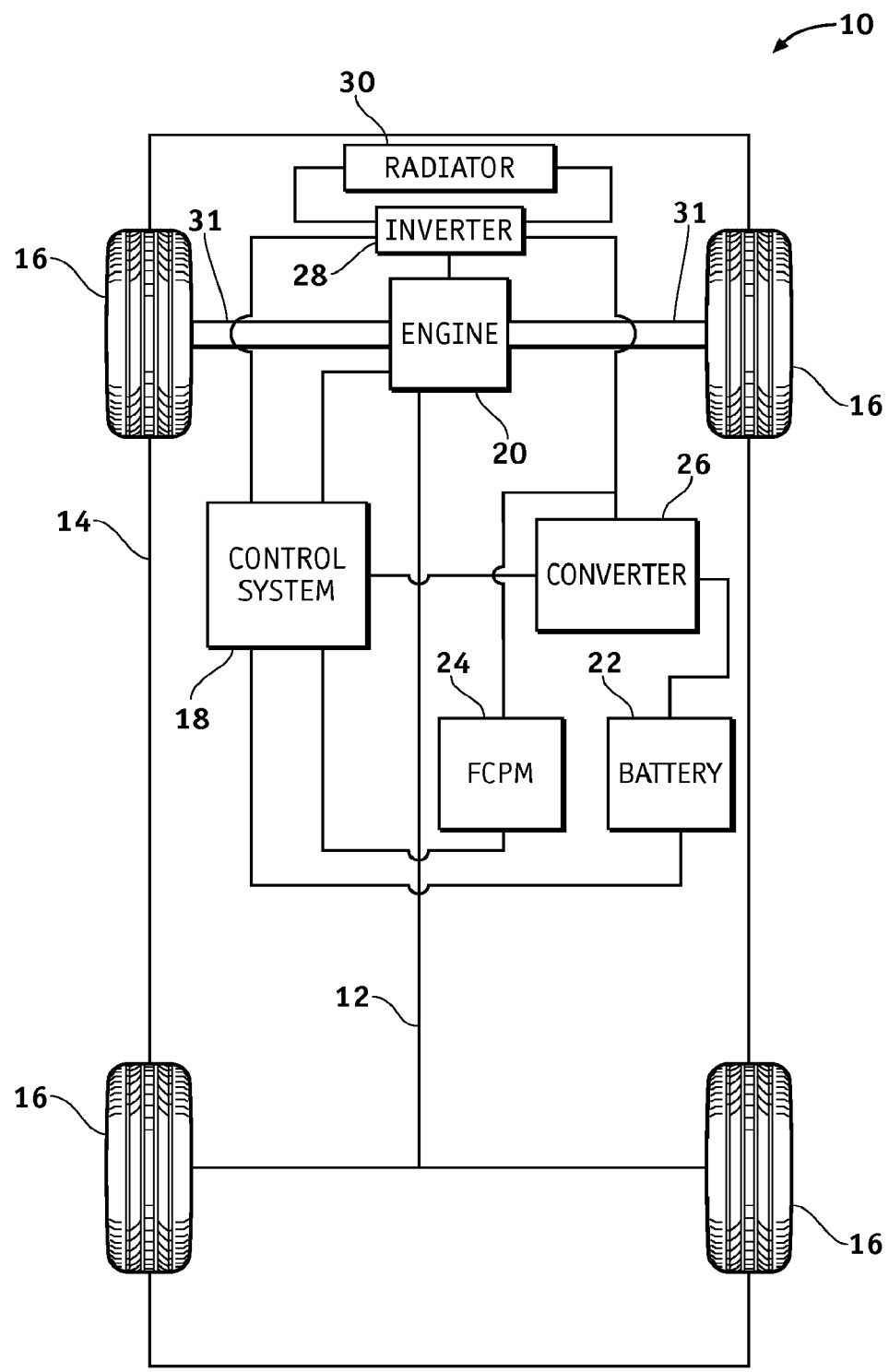
FIG. 1 is a schematic view of an exemplary automobile including a DC/DC converter system, according to one embodiment of the present invention.
Figure 2:
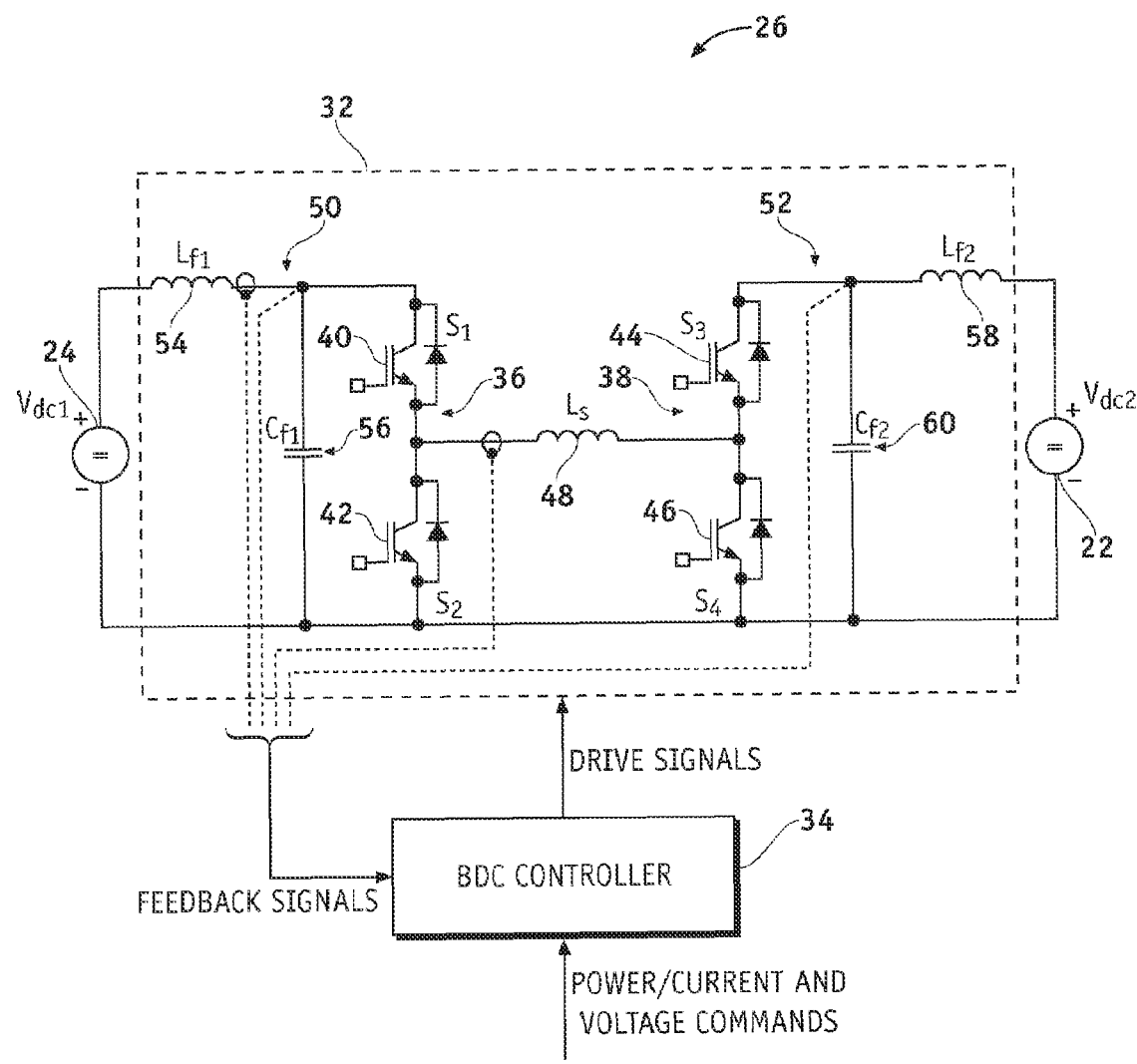
FIG. 2 is a schematic block diagram of the DC/DC converter system of FIG. 1.
Figure 3:
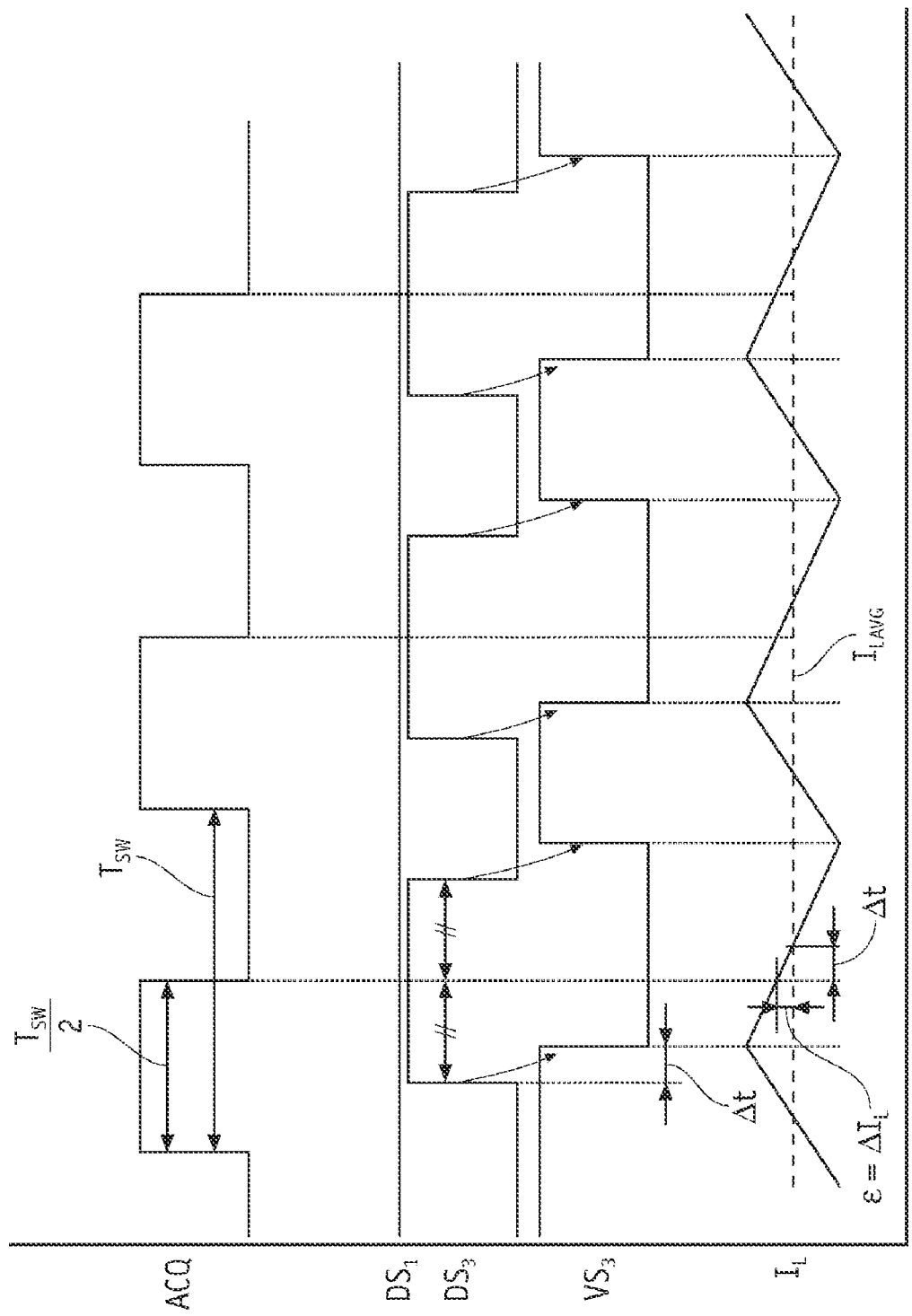
FIG. 3 is a temporal view of a method for adjusting current sampling in the DC/DC converter system of FIG. 2.

FIG. 1 to FIG. 3 illustrate a method and/or system for determining a current flowing through an electrical component. A switch, electrically coupled to the electrical component and two voltage sources, is activated. The activation of the switch causes current to flow through the electrical component. The amount of time between activating the switch and the flow of current through the electrical component is determined. The current flowing through the electrical component is measured to determine a measured current value. The measured current value is modified based at least in part on the amount of time between activating the switch and the flow of current through the electrical component.

As will be described in greater detail below, in one embodiment, the electrical component is an inductor within a direct current-to-direct current (DC/DC) converter. The two voltages sources may include a battery and a fuel cell within a fuel cell powered automobile.

FIG. 1 illustrates a vehicle, or automobile 10, according to one embodiment of the present invention. The automobile 10 includes a chassis 12, a body 14, four wheels 16, and an electronic control system 18. The body 14 is arranged on the chassis 12 and substantially encloses the other components of the automobile 10. The body 14 and the chassis 12 may jointly form a frame. The wheels 16 are each coupled to the chassis 12 near a respective corner of the body 14.

The automobile 10 may be any one of a number of different types of automobiles, such as, for example, a sedan, a wagon, a truck, or a sport utility vehicle (SUV), and may be two-wheel drive (2WD) (i.e., rear-wheel drive or front-wheel drive), four-wheel drive (4WD) or all-wheel drive (AWD). The vehicle 10 may also incorporate any one of, or combination of, a number of different types of engines, such as, for example, a gasoline or diesel fueled combustion engine, a "flex fuel vehicle" (FFV) engine (i.e., using a mixture of gasoline and alcohol), a gaseous compound (e.g., hydrogen and natural gas) fueled engine, a combustion/electric motor hybrid engine, and an electric motor.

In the exemplary embodiment illustrated in FIG. 1, the automobile 10 is a fuel cell vehicle, and further includes an electric motor/generator 20, a battery 22, a fuel cell power module (FCPM) 24, a DC/DC converter system 26, an inverter 28, and a radiator 30. Although not illustrated, the electric motor/generator 20 (or motor) includes a stator assembly (including conductive coils), a rotor assembly (including a ferromagnetic core), and a cooling fluid (i.e., coolant), as will be appreciated by one skilled in the art. The motor 20 may also include a transmission integrated therein such that the motor 20 and the transmission are mechanically coupled to at least some of the wheels 16 through one or more drive shafts 31.

As shown, the battery 22 and the FCPM 24 are in operable communication and/or electrically connected to the electronic control system 18 and the DC/DC converter system 26. Although not illustrated, the FCPM 24, in one embodiment, includes, amongst other components, a fuel cell having an anode, a cathode, an electrolyte, and a catalyst. As is commonly understood, the anode, or negative electrode, conducts electrons that are freed from, for example, hydrogen molecules so that they can be used in an external circuit. The cathode, or positive electrode (i.e., the positive post of the fuel cell), conducts the electrons back from the external circuit to the catalyst, where they can recombine with the hydrogen ions and oxygen to form water. The electrolyte, or proton exchange membrane, conducts only positively charged ions while blocking electrons. The catalyst facilitates the reaction of oxygen and hydrogen.

FIG. 2 schematically illustrates the DC/DC converter system 26 in greater detail. The converter system 26 includes a bi-directional DC/DC converter (BDC) 32 and a BDC controller 34. The BDC converter 32, in the depicted embodiment, includes a power switching section with two dual insulated gate bipolar transistor (IGBT) legs 36 and 38, each having two IGBTs, 40 ($S_1$) and 42 ($S_2$), and 44 ($S_3$) and 46 ($S_4$), respectively. The two legs 36 and 38 are interconnected at midpoints by a switching inductor 48 having an inductance ($L_S$). The BDC converter 32 also includes a first filter 50 connected to the positive rail of the first IGBT leg 36, and a second filter 52 connected to the positive rail of the second IGBT leg 38. As shown, the filters 50 and 52 include a first inductor 54, a first capacitor 56, a second inductor 58, and a second capacitor 60, respectively. The first IGBT leg 36 is connected to the FCPM 24 through the first filter 50, and the second IGBT leg 38 is connected to the battery 22 through the second filter 52. As shown, the FCPM 24 and the battery are not galvanically isolated, as the negative (−) terminals are electrically connected.

The BDC controller 34 is in operable communication with the BDC converter 32 as shown. Although illustrated as being a separate module, the BDC controller 34 may be implemented within the electronic control system 18 (FIG. 1), as is commonly understood in the art.

Although not illustrated, in one embodiment, the inverter 28 includes a plurality of power module devices. The power module devices may each include a semiconductor substrate (e.g., silicon substrate) with an integrated circuit, having a plurality of semiconductor devices (e.g., transistors and/or switches), formed thereon, as is commonly understood.

Referring again to FIG. 1, the radiator 30 is connected to the frame at an outer portion thereof and although not illustrated in detail, includes multiple cooling channels therethough that contain a cooling fluid (i.e., coolant) such as water and/or ethylene glycol (i.e., "antifreeze) and is coupled to the motor 20 and the inverter 28. In one embodiment, the inverter 28 receives and shares coolant with the electric motor 20. The radiator 30 may be similarly connected to the inverter 28 and/or the electric motor 20.

The electronic control system 18 is in operable communication with the motor 20, the battery 22, the FCPM 24, the DC/DC converter system 26, and the inverter 28. Although not shown in detail, the electronic control system 18 includes various sensors and automotive control modules, or electronic control units (ECUs), such as the BDC controller 34 (shown in FIG. 2) and a vehicle controller, and at least one processor and/or a memory which includes instructions stored thereon (or in another computer-readable medium) for carrying out the processes and methods as described below.

During operation, still referring to FIG. 1, the vehicle 10 is operated by providing power to the wheels 16 with the electric motor 20 which receives power from the battery 22 and the FCPM 24 in an alternating manner and/or with the battery 22 and the FCPM 24 simultaneously. In order to power the motor 20, DC power is provided from the battery 22 and the FCPM 24 to the inverter assembly 28, via the DC/DC converter system 26, which converts the DC power into alternating current (AC) power, before the power is sent to the electric motor 20.

The electronic control system 18 and/or the BDC controller 34 operate the DC/DC converter system 26 as discussed below. Referring again to FIG. 2, the DC/DC converter system 26 is digitally controlled and transfers power between the FCPM 24 ($V_{dc1}$) and the battery 22 ($V_{dc2}$). The terminal voltages of the FCPM 24 and the battery 22 may dynamically vary so that $V_{dc1} \geq V_{dc2}$ or $V_{dc1} \leq V_{dc2}$. The power transfer between the two voltage sources takes place under constant current or under constant power independently of the sign of the voltage relationship, as is commonly understood.

Still referring to FIG. 2, the first and second filters 50 and 52 reduce electromagnetic interference (EMI) emissions, as is commonly understood. In one embodiment, the switching inductor 48 is primarily responsible for the power conversion process, as the switching inductor 48 stores energy in a first part of the operating cycle and releases it in a second part of the operating cycle. Thus, the switching inductor 48 ensures that the energy transfer takes place in the desired direction, regardless of the voltaic relationship between the FCPM 24 and the battery 22.

A constant average current, equal to the desired average current, is impressed through the switching inductor 48. The control of the constant average current is generally performed under closed loop operation. The output of the current loop controls the voltage across the switching inductor 48 by switching the state of the IGBTs 40, 42, 44, and 44 ('ON' or 'OFF'). For example, in one embodiment, the IGBT (40 in the first leg 36 or 44 in the second leg 38) connected to the positive (+) terminal of the voltage source with the lower voltaic value is kept continuously 'ON' while the IGBTs on the opposing leg are switched 'ON'/'OFF' in order to achieve the power transfer. The rate of this switching may be referred to as the "switching frequency" ($f_{sw}$). The inverse, or reciprocal, of the switching frequency may be referred to as the "switching period" or "switching cycle" ($T_{sw}$). A switch, or IGBT 40-46, may be in the 'ON' state for a particular duration (i.e., an "on-period") within the switching period. The ratio of the 'ON' time of a particular switch divided by the switching period may be referred to as the "duty ratio" or "duty cycle." If considered individually, each duty cycle may be considered to have a beginning point (or leading edge), a mid-point, and a end-point (or trailing edge).

As indicated in FIG. 2, the BDC controller 34 receives power/current and voltage commands from an outside source (e.g., the vehicle controller). The control algorithm within the BDC controller 34 generates duty cycles of the IGBTs 40-46 ($S_1$-$S_4$). The BDC controller 34 also performs feedback measurements that are compared to the power and voltage commands. The duty cycles of the drive signals sent by the BDC controller 34 are adjusted so that the feedback values of the BDC controller 34 substantially match the power and voltage commands.

Because the BDC converter 32 is digitally controlled, the operation takes place in discrete time segments (i.e., cycles), which are equal to the switching period ($T_{sw}$). During each cycle, the BDC controller 34 (and/or the electronic control system 18) receives the feedback measurements, performs the calculations required by the control algorithm, including those related to the closed loop operation, and outputs duty cycles that control the IGBTs 40-46.

As one of the feedback measurements, the BDC controller 34 samples, or measures, the current ($I_L$) conducting through the switching inductor 48 once per switching cycle. Ideally, the point at which the sampling occurs within the switching cycle corresponds to the point in time where the current flowing through the switching inductor 48 is equal to its average value. Theoretically, because of the quasi-triangular shape of the current, as shown in FIG. 3, this instance corresponds to the mid-point of the switching cycle.

As shown in FIG. 3, in order to achieve the feedback current sampling at the mid-point of the switching cycle, a current acquisition signal (ACQ), including "current acquisition duty cycles," is generated within the BDC controller 34. In the example shown, the current acquisition signal has a 50% duty cycle. The inductor current $I_L$ is sampled substantially simultaneously with the end-point of the current acquisition signal (or current acquisition duty cycle). IGBT signals (e.g., $DS_1$ and $DS_3$), or switch signals, with corresponding duty cycles are generated symmetrically with respect to the end-point of the current acquisition signal such that the mid-point of the IGBT duty cycle $DS_3$ occurs simultaneously therewith. The duty cycles generated at cycle "n" are pre-calculated during the previous cycle "n−1."

In the example shown in FIG. 3, the duty cycle $DS_1$ has a value of 100%, while $DS_3$ has an arbitrary value. The voltage $VS_3$ across IGBT $S_3$ is delayed with respect to the control signal $DS_3$ because of the "non-zero" activation time of the IGBT. That is, for example, a brief period of time ($\Delta t$) passes between the beginning-point of each cycle of the control signal $DS_3$ and the corresponding voltage $VS_3$ across the IGBT, as will be appreciated by one skilled in the art. Consequently, the manifestation of the corresponding change in the current ($I_L$) through the switching inductor ($L_S$) is also delayed by $\Delta t$. As such, if the switching inductor current is sampled simultaneously with the trailing edge of the current acquisition cycle and the mid-point of the IGBT control signal $DS_3$, the sampling will occur $\Delta t$ before in the ideal mid-point where the instantaneous inductor current $I_L$ coincides with the average value of the inductor current ($I_{Lavg}$). It should be noted that the value of the delay $\Delta t$ may, for example, be measured by the BDC controller 34 or listed in reference material related to the particular equipment utilized.

Any inductor current value calculated as such will include an error ($\epsilon = \Delta I_L$), which corresponds to the difference between the average inductor current $I_{Lavg}$ and the instantaneous inductor current $I_L$ sampled. The error in the feedback inductor current likewise causes inaccuracy in the current between the two sources ($V_{dc1}$ and $V_{dc2}$). If this error is not accounted for, the operation of the DC/DC converter system 26, as well as the vehicle 10 as a whole, will be affected. The inaccuracy problem becomes a system issue at low current levels and at zero commanded current, where a small error in the measured feedback current is magnified percentage-wise in respect to the commanded current.

Still referring to FIG. 3, according to one embodiment of the present invention, the BDC controller 34 creates an additional signal, delayed by $\Delta t$, in order to account for the timing of the current sampling. In a preferred embodiment, the error $\Delta I_L$ is estimated or calculated in the current loop control code within the BDC controller 34 and applied it as a correction to the measured current $I_L$ to calculate a corrected feedback current ($I_L'$).

Four operating conditions can be identified for the converter system 26 shown: $V_{dc1} \geq V_{dc2}$ with $I_L \geq 0$, $V_{dc1} \geq V_{dc2}$ with $I_L \leq 0$, $V_{dc1} \leq V_{dc2}$ with $I_L \geq 0$, and $V_{dc1} \leq V_{dc2}$ with $I_L \leq 0$. In each of these situations, an approximation of the slope of the current $I_L$ may be expressed as $$\Delta I_L / \Delta t = (V_{dc1} - V_{dc2}) / L_S, \tag{1}$$

as will be appreciated by one skilled in the art. Consequently, the error $\Delta I_L$ may be expressed as $$\Delta I_L = \Delta t \cdot (V_{dc1} - V_{dc2}) / L_S \tag{2}$$

The corrected feedback current $I_L'$ to be used in the control loop may then be expressed as $$I_L' = I_L + \Delta I_L \tag{3}$$

That is, the corrected feedback current is equal to the sum of the measured current value of the switching inductor 48 and the measured current value error. The corrected feedback current $I_L'$ is repeatedly, or continuously, fed into the BDC controller 34 to control the operation of the DC/DC converter system 26.

One advantage of the method and/or system described above is that the accuracy with which the feedback current is determined is improved. As a result, the performance of the power converter system, as well as the motor, and the overall efficiency of the vehicle are improved.

Other embodiments may utilize the method and system described above in different types of automobiles, or in different electrical systems altogether, as it may be implemented in any situation where the voltages of the two sources dynamically change over a wide range. For example, in another embodiment, the battery could be replaced by an ultra-capacitor.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for determining a current flowing through an electrical component comprising:
    activating a switch electrically coupled to the electrical component and two voltage sources causing current to flow through the electrical component;
    determining an amount of time between said activating the switch and the flow of current through the electrical component;
    measuring the current flowing through the electrical component to determine a measured current value; and
    modifying the measured current value based at least in part on the amount of time.

2. The method of claim 1, further comprising:
    generating an acquisition signal having at least one acquisition duty cycle; and
    generating a switch signal having at least one switch duty cycle;
    wherein each of the at least one acquisition duty cycle and the at least one switch duty cycle have a beginning-point, a mid-point, and an end-point, and the mid-point of the at least one switch duty cycle occurs substantially simultaneously with the end-point of the at least one acquisition duty cycle.

3. The method of claim 2, wherein said activating the switch occurs substantially simultaneously with the beginning-point of the at least one switch duty cycle.

4. The method of claim 3, wherein the measuring of the current flowing through the electrical component occurs substantially simultaneously with the end-point of the at least one acquisition duty cycle.

5. The method of claim 4, wherein the electrical component is an inductor having an inductance and the two voltage sources comprise a first voltage source generating a first voltage and a second voltage source generating a second voltage.

6. The method of claim 5, wherein the modifying of the measured current value comprises calculating a current error.

7. The method of claim 6, wherein the calculating the current error comprises:
    determining a difference between the first voltage and the second voltage;
    dividing the difference between the first voltage and the second voltage by the inductance of the inductor to calculate a slope of the measured current value; and
    multiplying the slope of the measured current value by the amount of time between said activating the switch and the flow of current through the electrical component.

8. The method of claim 7, wherein the switch and the inductor are within a direct current-to-direct current (DC/DC) converter.

9. The method of claim 8, wherein the DC/DC converter further comprises at least one filter, the at least one filter comprising a capacitor and a filter inductor.

10. The method of claim 9, wherein the first voltage source is a battery and the second voltage source is a fuel cell.

11. A method for determining a current flowing through an electrical component within a direct current-to-direct current (DC/DC) converter in an automobile comprising:
    generating an acquisition signal having at least one acquisition duty cycle having a beginning-point, a mid-point, and an end-point;
    generating a switch signal having at least one switch duty cycle having a beginning-point, a mid-point, and an end-point, the mid-point of the switch duty cycle occurring substantially simultaneously with the end-point of the at least one acquisition duty cycle;
    activating a switch electrically coupled to the electrical component and two voltage sources substantially simultaneously with the beginning point of the switch duty cycle, said activating the switch causing the current to flow through the electrical component after an amount of time;
    determining the amount of time between said activating the switch and the flow of current through the electrical component;
    measuring the current flowing through the electrical component substantially simultaneously with the mid-point of the switch duty cycle to determine a measured current value; and
    modifying the measured current value based at least in part on the amount of time between said activating the switch and the flow of current through the electrical component.

12. The method of claim 11, wherein the electrical component is an inductor having an inductance and the two voltage sources comprise a first voltage source generating a first voltage and a second voltage source generating a second voltage.

13. The method of claim 12, wherein the modifying of the measured current value comprises:
    determining a difference between the first voltage and the second voltage;
    dividing the difference between the first voltage and the second voltage by the inductance of the inductor to calculate a slope of the measured current value; and
    multiplying the slope of the measured current value by the amount of time between said activating the switch and the flow of current through the electrical component.

14. The method of claim 13, wherein the switch is an insulated gate bipolar transistor (IGBT).

15. The method of claim 14, wherein the first voltage source is a battery and the second voltage source is a fuel cell.

16. An automotive drive system comprising:
    a power converter configured to be coupled to a first voltage source and a second voltage source, the power converter comprising a switch and an inductor having an inductance;
    an electric motor coupled to the power converter; and
    a microprocessor in operable communication with the power converter, the microprocessor being configured to:
    activate the switch to cause current to flow through the inductor after an amount of time;
    determine the amount of time between the activation of the switch and the flow of current through the inductor;
    determine a measured current value of the current flowing through the inductor; and
    modify the measured current value based at least in part on the amount of time between the activation of the switch and the flow of current through the inductor.

17. The automotive drive system of claim 16, wherein the power converter is a direct current-to-direct current (DC/DC) converter.

18. The automotive drive system of claim 16, wherein the microprocessor is further configured to:
   generate an acquisition signal having at least one acquisition duty cycle; and
   generate a switch signal having at least one switch duty cycle;
   wherein each of the at least one acquisition duty cycle and the at least one switch duty cycle have a beginning-point, a mid-point, and an end-point, the mid-point of the at least one switch duty cycle occurs substantially simultaneously with the end-point of the at least one acquisition duty cycle, the activation of the switch occurs substantially simultaneously with the beginning-point of the at least one switch duty cycle, and the measurement of the current flowing through the electrical component occurs substantially simultaneously with the end-point of the at least one acquisition duty cycle.

19. The automotive drive system of claim 18, wherein the modification of the measured current value comprises:
   determining a difference between the first voltage and the second voltage;
   dividing the difference between the first voltage and the second voltage by the inductance of the inductor to calculate a slope of the measured current value; and
   multiplying the slope of the measured current value by the amount of time between said activating the switch and the flow of current through the electrical component.

20. The automotive drive system of claim 19, wherein the first voltage source is a battery and the second voltage source is a fuel cell.

* * * * *